United States Patent
Cheng et al.

(10) Patent No.: US 8,106,389 B2
(45) Date of Patent: Jan. 31, 2012

(54) THIN FILM TRANSISTOR WITH SEMICONDUCTOR PRECURSOR AND LIQUID CRYSTAL DISPLAY HAVING THE SAME

(75) Inventors: Hsiang-Yuan Cheng, Taipei (TW); Shin-Chuan Chiang, Taipei (TW); Shih-Hsiang Lai, Taipei County (TW); Chin-Chih Yu, Hsinchu (TW); Bor-Chuan Chuang, Tainan County (TW)

(73) Assignees: Taiwan TFT LCD Association, Hsinchu (TW); Chunghwa Picture Tubes, Ltd., Taoyuan (TW); Au Optronics Corporation, Hsinchu (TW); Hannstar Display Corporation, Tainan County (TW); Chi Mei Optoelectronics Corporation, Tainan County (TW); Industrial Technology Research Institute, Hsinchu (TW); TPO Displays Corp., Miao-Li County (TW)

( * ) Notice: Subject to any disclaimer, the term of this patent is extended or adjusted under 35 U.S.C. 154(b) by 99 days.

(21) Appl. No.: 12/607,991

(22) Filed: Oct. 28, 2009

(65) Prior Publication Data
US 2010/0044696 A1 Feb. 25, 2010

Related U.S. Application Data

(62) Division of application No. 11/614,977, filed on Dec. 22, 2006, now Pat. No. 7,745,267.

(30) Foreign Application Priority Data

Sep. 4, 2006 (TW) ............................ 95132538 A
Nov. 7, 2006 (TW) ............................ 95141133 A

(51) Int. Cl.
*H01L 29/12* (2006.01)
(52) U.S. Cl. ............... 257/40; 257/43; 257/E29.151
(58) Field of Classification Search ............ 257/40–43
See application file for complete search history.

(56) References Cited

U.S. PATENT DOCUMENTS

2006/0284171 A1* 12/2006 Levy et al. .............. 257/43
2010/0259703 A1* 10/2010 Song ...................... 349/43

* cited by examiner

*Primary Examiner* — Thanh Nguyen
(74) *Attorney, Agent, or Firm* — Jianq Chyun IP Office

(57) ABSTRACT

A thin film transistor is provided. The thin film transistor includes a substrate, a gate, a source/drain, an insulating layer, and a semiconductor active layer. The gate and the source/drain are respectively deposited on the substrate and are separated by the insulating layer on the substrate. The semiconductor active layer connects the source and the drain. The material of the semiconductor active layer is a semiconductor precursor which produces semiconductor property after being irradiated by a light source. A liquid crystal display which includes the above thin film transistor is also provided.

20 Claims, 2 Drawing Sheets

THIN FILM TRANSISTOR WITH SEMICONDUCTOR PRECURSOR AND LIQUID CRYSTAL DISPLAY HAVING THE SAME

CROSS-REFERENCE TO RELATED APPLICATION

This application is a divisional application of and claims priority benefit of U.S. application Ser. No. 11/614,977, filed on Dec. 22, 2006, now pending, which claims the priority benefit of Taiwan application serial no. 95132538, filed Sep. 4, 2006 and Taiwan application serial no. 95141133, filed Nov. 7, 2006. The entirety of each of the above-mentioned patent applications is hereby incorporated by reference herein and made a part of this specification.

BACKGROUND OF THE INVENTION

1. Field of the Invention

The invention relates to a thin film transistor and a method of fabricating an active layer thereof. More particularly, the invention relates to a method of fabricating an active layer which can be directly performed in atmospheric air, a thin film transistor having the active layer, and a liquid crystal display.

2. Description of Related Art

Amorphous silicon transistor and low temperature polycrystalline transistor are the two major thin film transistors in today's active flat panel displays. Vacuum coating and photolithography processes are required for manufacturing such transistors.

Accordingly, the research and development of new thin film transistor technique has been focused, wherein the method of fabricating thin film transistor using liquid process has become today's major subject. In recent years, methods of manufacturing II-VI compound, for example, ZnO, thin film transistor using liquid process is quick and simple, besides, no vacuum equipment is required for such processes. Moreover, the use of amorphous silicon transistor greatly improves the performance of the device. Accordingly, the advantage of applying thin film transistor to large-size products is greatly increased.

Regarding ZnO semiconductor, the existing methods for manufacturing thin film transistor with ZnO precursor solution is capable of evenly distributing ZnO nano particles in solvent, or the ZnO sol-gel solution is coated on a substrate by using a conventional method first, and then the residual solvent may be removed through conventional thermal process. Finally, recrystallization is performed. Good device characteristics can be obtained by using these methods. However, as the process temperatures are usually higher than 500° C., which may adversely affect the throughput.

SUMMARY OF THE INVENTION

According to an aspect of the invention, a thin film transistor having an active layer is provided, wherein the active layer can be manufactured in atmospheric environment under room temperature.

According to yet another aspect of the invention, a liquid crystal display having the foregoing thin film transistor is provided.

The invention further provides a thin film transistor including a substrate, a gate, a source/drain, an insulating layer, and a semiconductor active layer. The gate and the source/drain are respectively deposited on the substrate and are separated by the insulating layer on the substrate. The semiconductor active layer connects the source and the drain. The material of the semiconductor active layer is a semiconductor precursor which produces semiconductor property after being irradiated by a light source.

The invention further provides a liquid crystal display including a display substrate, a counter substrate, and a liquid crystal layer disposed between the display substrate and the counter substrate. The display substrate includes a first substrate, a first electrode layer deposited on the first substrate, a foregoing thin film transistor deposited on the first substrate and electrically connected to the first electrode layer, and a first alignment film deposited on the first electrode layer. The counter substrate includes a second substrate, a second electrode layer deposited on the second substrate, and a second alignment film disposed on the second electrode layer.

In order to make the aforementioned and other objects, features and advantages of the invention comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
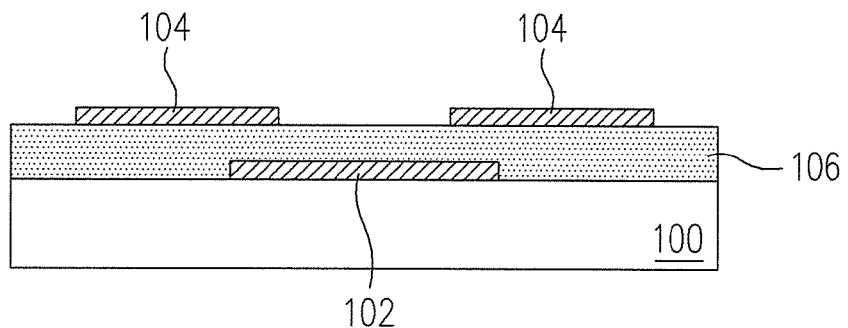
FIGS. 1A~1C are cross-sectional views illustrating the manufacturing flow of an active layer of a thin film transistor according to the first embodiment of the invention.
Figure 1B:
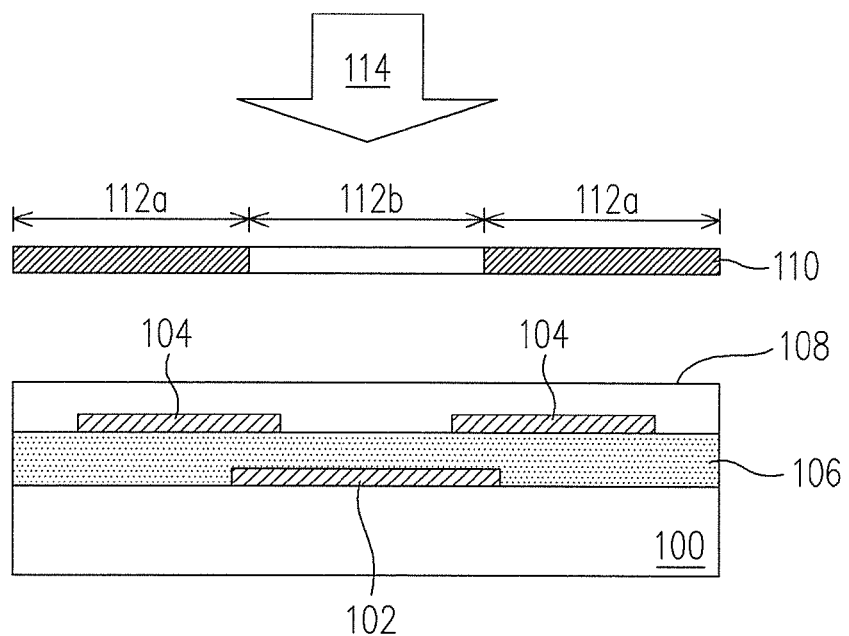
Figure 1C:
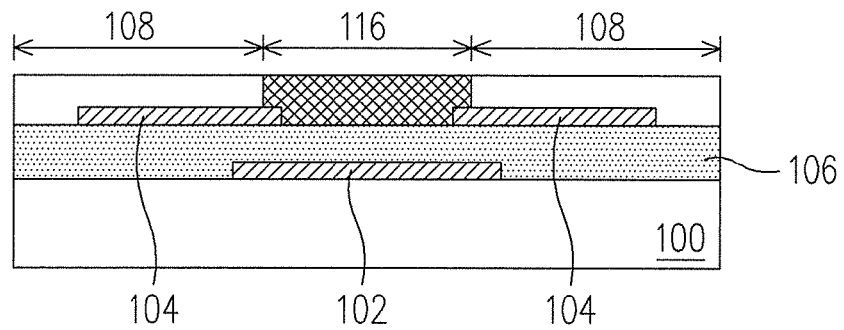

FIGS. 1A~1C are cross-sectional views illustrating the manufacturing flow of an active layer of a thin film transistor according to the first embodiment of the invention.

Referring to FIG. 1A, a substrate 100 having a gate 102 and a source/drain 104 formed thereon is provided, and an insulating layer 106 which separates the gate 102 and the source/drain 104 is further deposited on the substrate 100. For the application to large size products, the substrate 100 may be a Si wafer, a glass substrate, a ceramic substrate, a metal substrate, a paper substrate, or a plastic substrate. The gate 102 and the source/drain 104 may be comprised of metal material, transparent conductive material, and organic conductive material, wherein the metal material may be Al, Cu, Mo, Ag, or Au, the transparent conductive material may be indium tin oxide (ITO) or antimony tin oxide (ATO), and the organic conductive material may be poly (3, 4-ethylene dioxythiophene) (PEDOT). The insulating layer 106 may include organic insulating material such as poly (vinyl pyrrolidone) (PVP), polyvinyl alcohol (PVA), poly (methyl methacrylate) (PMMA), and polyimide (PI), or inorganic insulating material such as $SiO_x$, $SiN_x$, LiF, and $Al_2O_3$. Even though only a bottom-gate thin film transistor is illustrated in the figures of the first embodiment, the invention may also be applied to other types of thin film transistors, such as a top-gate thin film transistor.

Referring to FIG. 1B, a semiconductor precursor solution is then prepared through a liquid process which may be sol-gel, chemical bath deposition, photo-chemical deposition, or evenly distributing suitable semiconductor nano particles into a solvent. After that, the semiconductor precursor solution is provided on the substrate 100 to form a semiconductor precursor thin film 108, and the method used herein may be spin-coating, inkjet printing, drop-printing, casting, micro-contact, micro-stamp, or dipping. The material of the semiconductor precursor thin film 108 may be II-VI compound semiconductor precursor, and other II-VI compound semiconductor precursors may also be used besides ZnO adopted in following embodiments. Here a soft baking step is performed selectively to remove organics in the semiconductor precursor solution.

Referring to FIG. 1B again, a light source 114 is used to irradiate the semiconductor precursor thin film 108 to remove residual solvent in the semiconductor precursor thin film 108 and transform the semiconductor precursor thin film 108 into a semiconductor layer having semiconductor property. In this embodiment, the light source 114 has a wavelength between 5 nm and 750 nm and an energy density between 0.01 mj/cm$^2$ and 1200 mj/cm$^2$. For example, the light source 114 may be KrF excimer laser of 248 nm, H-20 UV (referring to Journal of CRYSTAL GROWTH 256 (2003) pages 73-77, titled as "Photoconductive UV detectors on sol-gel-synthesized ZnO films") between 300 nm and 750 nm, Nd:YAG laser (referring to IEEE Photonics Technology Letters, Vol. 16, No. 11 (November, 2004) pages 2418-2420, titled as "Sol-Gel ZnO—SiO$_2$ Composite Waveguide Ultraviolet Lasers") of 355 nm, or other light sources of suitable wavelengths. Besides, to accomplish patterned effect, a mask 110 composed of a non-transmissive region 112a and a transmissive region 112b may be provided as a mask before irradiating the semiconductor precursor thin film 108 with the light source 114.

Referring to FIG. 1C, the semiconductor precursor thin film 108 irradiated by the light source (the light source 114 in FIG. 1B) then transforms into a semiconductor active layer 116. In an embodiment of the invention, the semiconductor precursor thin film 108 that is not irradiated by the light source can be removed selectively and the solvent used for preparing the semiconductor precursor solution can be used directly so that no photolithography process is required.

The actual procedure of the first embodiment will be described in following example.

EXAMPLE

In this example, the zinc oxide (ZnO) sol-gel solution is prepared with sol-gel. First, 100 ml 2-methoxyethanol and 3.62 ml monoethanol amine (MEA) are mixed into a mixture solution, and then 13.2 g zinc acetate is dissolved into the mixture solution. The mixture solution is stirred for 30 minutes at 60° C. to be confectioned into a ZnO precursor solution.

After that, the foregoing ZnO precursor solution is formed on a glass substrate through spin-coating having an ITO gate (~1 kÅ) and a source/drain (~1 kÅ) a layer of SiO$_2$ has been deposited between the gate and the source/drain serving as an insulating layer (~3 kÅ) formed thereon. Next, a step of soft baking is performed at 200° C. to transform the ZnO precursor solution into a ZnO thin film. Eventually, a KrF excimer laser having a wavelength of 248 nm is used for irradiating the ZnO thin film over the device channel (the area between the source and the drain) through a mask to remove organic bonding in the ZnO thin film and to transform the ZnO from insulative into semiconductive, so as to obtain the desired thin film transistor.

When the voltage at the gate of the thin film transistor is 100V and the voltage at the drain thereof is also 100V, the current on/off ratio of the ZnO thin film transistor is 10$^3$, and the carrier mobility thereof is 1.81×10$^{-4}$ cm$^2$ /Vs.

Figure 2:
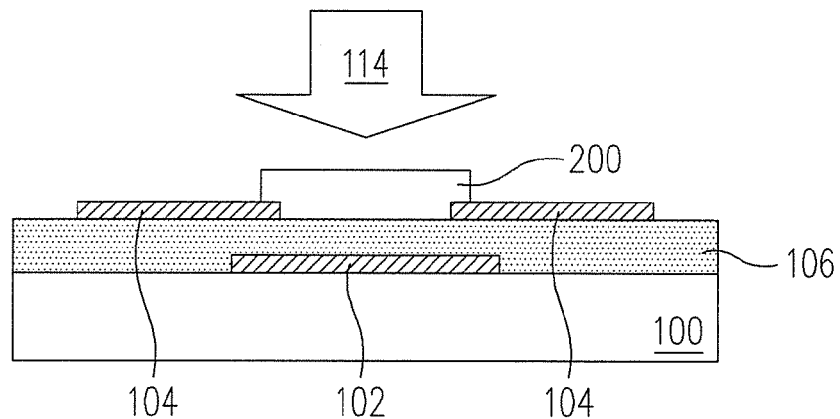
FIG. 2 is a cross-sectional view illustrating the method of fabricating an active layer of a thin film transistor according to the second embodiment of the invention.

FIG. 2 is a cross-sectional view illustrating the fabrication process of an active layer of a thin film transistor according to the second embodiment of the invention, wherein the same reference numerals as those in the first embodiment are used.

Referring to FIG. 2, the difference of FIG. 2 from the first embodiment is that the semiconductor precursor thin film 200 with a desired pattern may be formed using, such as inkjet printing, drop-printing, casting, micro-contact, or micro-stamp. Accordingly, no mask is required for irradiating the semiconductor precursor thin film 200 with the light source 114.

Figure 3:
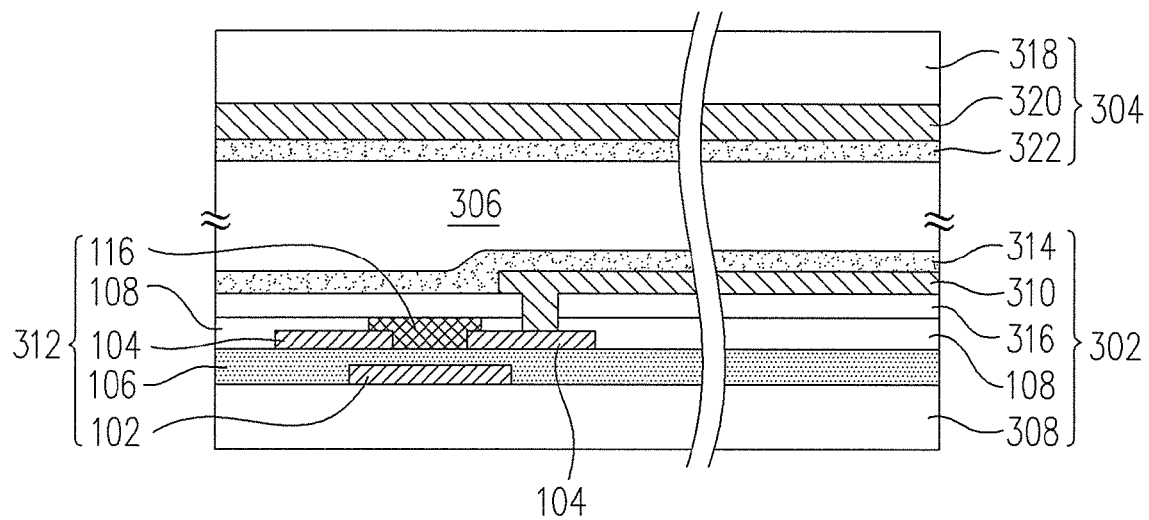
FIG. 3 is a cross-sectional view illustrating the structure of a liquid crystal display according to the third embodiment of the invention.

FIG. 3 is a cross-sectional view illustrating the structure of a liquid crystal display according to the third embodiment of the invention.

Referring to FIG. 3, in the present embodiment, the liquid crystal display includes a display substrate 302, a counter substrate 304, and a liquid crystal layer 306 between the display substrate 302 and the counter substrate 304. The display substrate 302 includes a first substrate 308, a first electrode layer 310 formed on the first substrate 308, a thin film transistor 312 deposited on the first substrate 308 and electrically connected to the first electrode layer 310, and a first alignment film 314 deposited on the first electrode layer 310. Wherein the thin film transistor 312 is a thin film transistor formed in the first embodiment and which includes a gate 102, a source/drain 104, an insulating layer 106, and a semiconductor active layer 116. The semiconductor active layer 116 connecting the source/drain 104 may be a ZnO II-VI compound semiconductor layer, and the materials of the other layers can be referred to the first embodiment. Besides, the thin film transistor 312 also includes a semiconductor precursor thin film 108 connected to the semiconductor active layer 116; however, the semiconductor precursor thin film 108 may also be removed.

Referring to FIG. 3 again, a passivation layer 316 may be further deposited between the first electrode layer 310 and the thin film transistor 312. The counter substrate 304 includes a second substrate 318, a second electrode layer 320 formed on the second substrate 318, and a second alignment film 322 deposited on the second electrode layer 320. The first and the second alignment layers 314 and 322 may be rubbing alignment layers, photo alignment layers, or ion alignment layers.

Besides being applied to the active-matrix liquid crystal display in the third embodiment, the thin film transistor in the invention may also be applied to other types of displays or equipments such as smart card, price tag, inventory tag, solar cell, and large-area sensor array.

In summary, a liquid process is adopted along with a light source of suitable wavelength and energy in the invention to replace the conventional thermal process. Thus, the process of the invention can be performed in atmospheric air where only partial heating is required. Accordingly, the process is suitable for manufacturing large-size products. Alternatively, a desired pattern may be formed, and therefore no additional photolithography or etching process is required, accordingly the process can be simplified.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A thin film transistor, comprising:
   a substrate;
   a gate, a source, and a drain, respectively disposed on the substrate;
   an insulating layer, disposed on the substrate isolating the gate and the source/drain; and
   a semiconductor active layer, connecting the source and the drain, wherein the material of the semiconductor active layer comprises a II-VI compound semiconductor having semiconductor property; and
   a semiconductor precursor thin film, connected to the semiconductor active layer and the source and the drain, wherein the semiconductor precursor thin film comprises a II-VI compound semiconductor precursor without semiconductor property.

2. The thin film transistor as claimed in claim 1, wherein the II-VI compound semiconductor precursor comprises ZnO.

3. The thin film transistor as claimed in claim 1, further comprising a semiconductor precursor thin film connected to the semiconductor active layer and having the same material as the semiconductor precursor.

4. The thin film transistor as claimed in claim 1, wherein the substrate comprises Si wafer, glass substrate, ceramic substrate, metal substrate, paper substrate, or plastic substrate.

5. The thin film transistor as claimed in claim 1, wherein the source, the drain and the gate respectively comprise metal material, transparent conductive material or organic conductive material.

6. The thin film transistor as claimed in claim 5, wherein metal material comprises Al, Cu, Mo, Ag, or Au.

7. The thin film transistor as claimed in claim 5, wherein transparent conductive material comprises indium tin oxide (ITO) or antimony tin oxide (ATO).

8. The thin film transistor as claimed in claim 5, wherein organic conductive material comprises poly (3, 4-ethylenedioxy- thiophene) (PEDOT).

9. The thin film transistor as claimed in claim 1, wherein the insulating layer comprises organic insulating material or inorganic insulating material.

10. The thin film transistor as claimed in claim 9, wherein organic insulating material comprises poly (vinyl pyrrolidone) (PVP), polyvinyl alcohol (PVA), poly (methyl methacrylate) (PMMA), or polyimide (PI).

11. The thin film transistor as claimed in claim 9, wherein inorganic insulating material comprises SiOx, SiNx, LiF, or $Al_2O_3$.

12. A liquid crystal display, comprising:
    a display substrate, comprising:
    a first substrate;
    a first electrode layer, disposed on the first substrate;
    a thin film transistor as claimed in claim 1, disposed on the first substrate and electrically connected to the first electrode layer;
    a first alignment film, disposed on the first electrode layer;
    a counter substrate, comprising:
    a second substrate;
    a second electrode layer, disposed on the second substrate;
    a second alignment film, disposed on the second electrode layer; and
    a liquid crystal layer, disposed between the display substrate and the counter substrate.

13. The liquid crystal display as claimed in claim 12, wherein the II-VI compound semiconductor layer comprises a ZnO semiconductor layer.

14. The liquid crystal display as claimed in claim 12, wherein the source, the drain, and the gate in the thin film transistor respectively comprise metal material, transparent conductive material or organic conductive material.

15. The liquid crystal display as claimed in claim 14, wherein metal material comprises Al, Cu, Mo, Ag, or Au.

16. The liquid crystal display as claimed in claim 14, wherein transparent conductive material comprises ITO or ATO.

17. The liquid crystal display as claimed in claim 14, wherein organic conductive material comprises PEDOT.

18. The liquid crystal display as claimed in claim 12, wherein the insulating layer of the thin film transistor comprises organic insulating material or inorganic insulating material.

19. The liquid crystal display as claimed in claim 18, wherein organic insulating material comprises PVP, PVA, PMMA, or PI.

20. The liquid crystal display as claimed in claim 18, wherein inorganic insulating material comprises SiOx, SiNx, LiF, or $Al_2O_3$.

* * * * *